United States Patent
Lim

(10) Patent No.: US 7,323,795 B2
(45) Date of Patent: Jan. 29, 2008

(54) APPARATUS FOR POWERING ON BY PUSHING RANDOM KEY

(75) Inventor: Heui-Do Lim, Suwon-shi (KR)

(73) Assignee: Samsung Electronics Co., Ltd (KR)

( * ) Notice: Subject to any disclaimer, the term of this patent is extended or adjusted under 35 U.S.C. 154(b) by 410 days.

(21) Appl. No.: 10/316,597

(22) Filed: Dec. 11, 2002

(65) Prior Publication Data

US 2003/0107501 A1 Jun. 12, 2003

(30) Foreign Application Priority Data

Dec. 12, 2001 (KR) .............................. 2001-78420

(51) Int. Cl.
 *H02B 1/22* (2006.01)
 *G06F 1/26* (2006.01)
 *G06F 3/02* (2006.01)
(52) U.S. Cl. ..................... 307/115; 713/310; 341/22
(58) Field of Classification Search ................ 307/115, 307/113, 114; 713/310, 300; 341/20, 22; 200/5 R, 329, 520, 341
See application file for complete search history.

(56) References Cited

U.S. PATENT DOCUMENTS

| | | | | |
|---|---|---|---|---|
| 3,534,904 A | * | 10/1970 | Kalthoff et al. ............... | 234/48 |
| 4,959,831 A | * | 9/1990 | Wroblewski .................. | 341/26 |
| 5,347,167 A | * | 9/1994 | Singh .......................... | 713/310 |
| 5,692,203 A | * | 11/1997 | Grodevant ................... | 713/310 |
| 6,717,531 B2 | * | 4/2004 | Hayashi ....................... | 341/22 |

* cited by examiner

*Primary Examiner*—Michael Sherry
*Assistant Examiner*—Andrew Deschere
(74) *Attorney, Agent, or Firm*—The Farrell Law Firm, PC

(57) ABSTRACT

An apparatus for powering on a terminal with a keypad by randomly selecting any key of the keypad. The keypad includes a plurality of keys, each of which has at least one set of contacts. The apparatus comprises a device controlled in such a manner as to be enabled to receive a battery voltage and supply a system voltage, a controller for, upon sensing a random key selection, generating a power on/off signal of a first state to continuously supply power to the terminal until a power off state is sensed and, upon sensing a power on state, generating a key on/off signal of a first state to operate subsequent input keys as general keys, and a key array switch including a plurality of first switches each for connecting one of the two contacts of each key arrayed in a corresponding row to the battery voltage, and a plurality of second switches each for connecting the other contact of each key arrayed in a corresponding column to an enable terminal of the system voltage supply device, the key array switch being disabled in response to the key on/off signal of the first state.

6 Claims, 3 Drawing Sheets

APPARATUS FOR POWERING ON BY PUSHING RANDOM KEY

PRIORITY

This application claims priority to an application entitled "APPARATUS FOR POWERING ON BY PUSHING RANDOM KEY", filed in the Korean Industrial Property Office on Dec. 12, 2001 and assigned Serial No. 2001-78420, the contents of which are hereby incorporated by reference.

BACKGROUND OF THE INVENTION

1. Field of the Invention

The present invention relates to an apparatus for controlling the supply of power to a terminal having a keypad, and more particularly to an apparatus for powering on a terminal through the use of a random key of the terminal.

2. Description of the Related Art

It is common that a specific power key is provided in a terminal with a keypad to turn on/off power of the terminal.

FIG. 1 shows the construction of a conventional apparatus for powering on a terminal with a keypad through the use of the keypad.

As shown in FIG. 1, if the terminal is powered off, an enable terminal EN of a device 400 for supplying a system voltage Vs, e.g. a regulator, goes low in level, so the terminal remains powered off. If a power key, e.g. KEY(0,0), is pushed for a predetermined period of time under this condition, a battery voltage Vbatt is applied to the enable terminal EN of the regulator 400 via the power key KEY (0,0) and a diode 200 to enable the regulator 400. As a result, the system voltage Vs is supplied to the terminal, which then begins operate.

However, there is only one power key, which frequently inconveniences a user. For example, in order to power on the terminal during a dark night under the condition that the terminal is in a power off state, the user has to accurately find and push the power key. Furthermore, in the case where the terminal is of a flip or folder model, the power key is typically positioned inside a flip or folder. In this case, the user must open the flip or folder and then push the power key to power on the terminal.

SUMMARY OF THE INVENTION

Therefore, the present invention has been made in view of the above problems, and it is an object of the present invention to provide an apparatus for powering on a terminal by allowing a user to push a random key of the terminal under the condition that the terminal is in a power off state.

In accordance with one aspect of the present invention, the above and other objects can be accomplished by the provision of an apparatus for powering on a terminal with a keypad by pushing a random key of the keypad, comprising: the keypad including a plurality of keys, each of the keys having contacts of two poles; a device controlled in such a manner as to be enabled to receive a battery voltage and supply a system voltage; a controller for, upon sensing a random key input, generating a power on/off signal of a first state to continuously supply power to the terminal until a power off state is sensed and, upon sensing a power on state, generating a key on/off signal of a first state to operate subsequent input keys as general keys; and a key array switch including a plurality of first switches each for connecting one of the two contacts of each key arrayed in a corresponding row to the battery voltage, and a plurality of second switches each for connecting the other contacts of each key arrayed in a corresponding column to an enable terminal of the system voltage supply device, the key array switch being disabled in response to the key on/off signal of the first state.

In accordance with another aspect of the present invention, there is provided an apparatus for powering on a terminal with a keypad by pushing a random key of the keypad, comprising: the keypad including a plurality of tetracontact keys, each of the keys having contacts of four contacts; a device controlled in such a manner as to be enabled to receive a battery voltage and supply a system voltage; a controller for, upon sensing a random key input, generating a power on/off signal of a first state to continuously supply power to the terminal until a power off state is sensed and, upon sensing a power on state, generating a key on/off signal of a first state; and a key array switch including a first switch for connecting one of the four contacts of each key arrayed in all rows to the battery voltage, and a second switch for connecting another one of the four contacts of each key arrayed in all columns to an enable terminal of the system voltage supply device, the key array switch being disabled in response to the key on/off signal of the first state.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
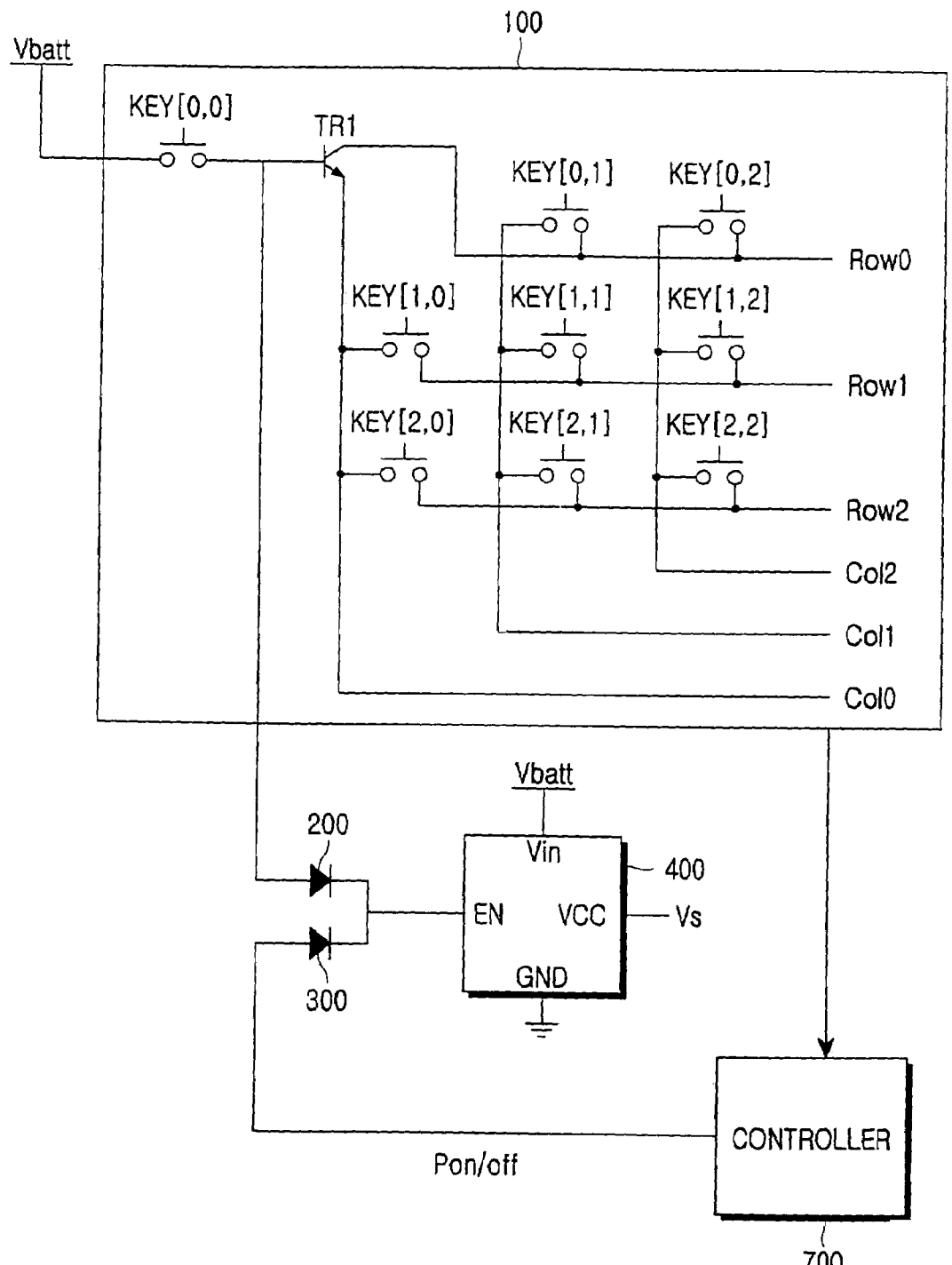
FIG. 1 is a circuit diagram showing the construction of a conventional apparatus for powering on a terminal with a keypad through the use of the keypad.

Now, preferred embodiments of the present invention will be described in detail with reference to the annexed drawings. In the drawings, the same or similar elements are denoted by the same reference numerals even though they are depicted in different drawings. In the following description made in conjunction with the preferred embodiments of the present invention, a variety of specific elements such as constituting elements of various circuits are specifically shown and described. The description of such elements has been made only for a better understanding of the present invention. Those skilled in the art will appreciate that the present invention can be implemented without using the above-mentioned specific elements. In the following description of the present invention, details of known functions and configurations are omitted to avoid obscuring the subject matter of the present invention.

Figure 2:
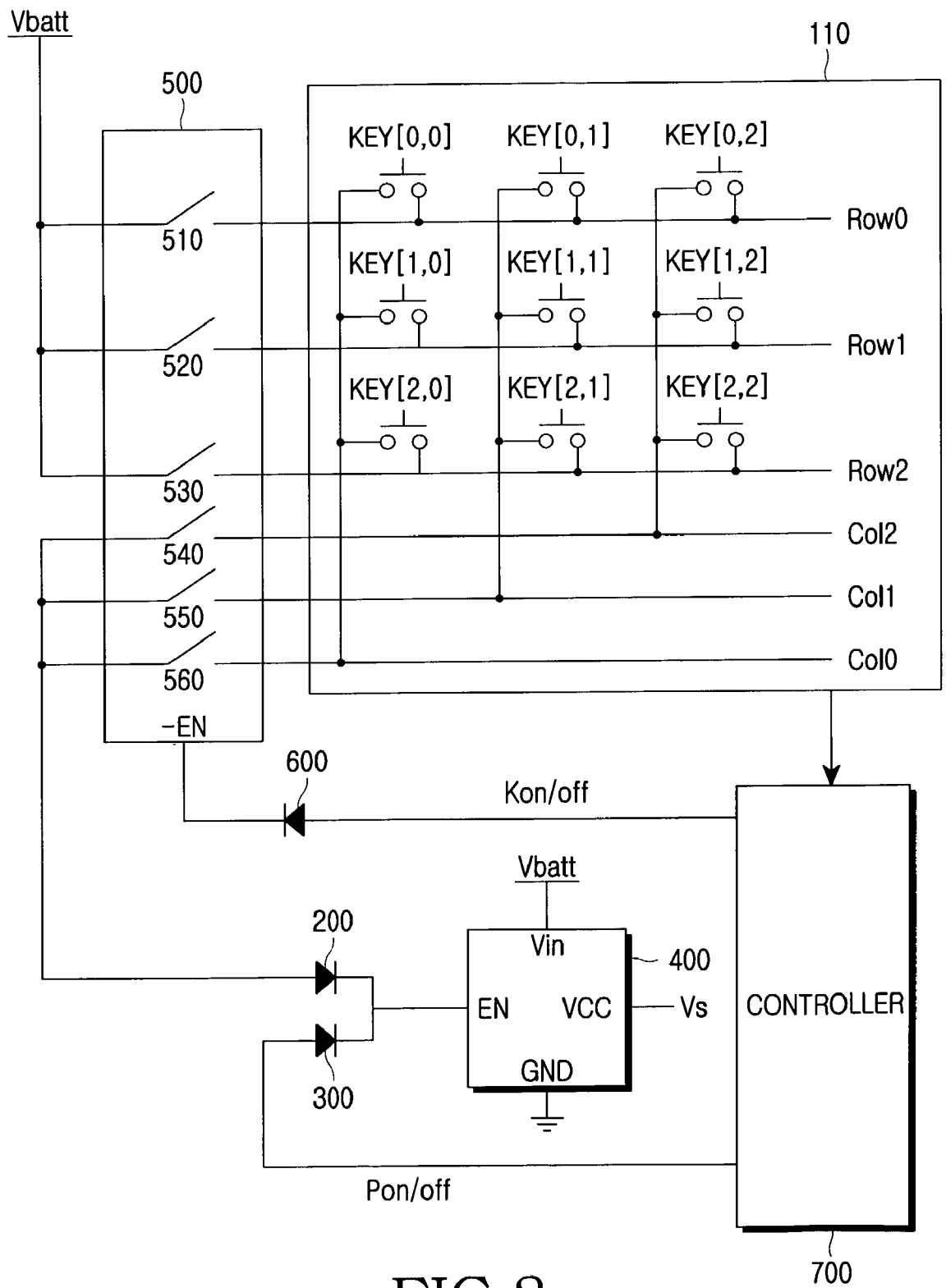
FIG. 2 is a circuit diagram showing the construction of an apparatus for powering on a terminal with a keypad through the use of a random key of the keypad in accordance with a preferred embodiment of the present invention.

FIG. 2 shows the construction of an apparatus for powering on a terminal with a keypad through the use of a random key of the keypad in accordance with a preferred embodiment of the present invention.

The keypad 110 includes a plurality of keys each having two contacts that electrically connect when a user selects the key. A device 400 for supplying a system voltage Vs, e.g. a regulator, receives a battery voltage Vbatt and outputs the system voltage Vs upon receipt of an enabling signal EN. If an arbitrary key on the keypad 110 is selected by a user, a controller 700 generates a power on/off signal of a first state to continuously supply power to the terminal until a power off state is sensed even though the arbitrary key is not continuously depressed by the user. The controller 700 also generates a key on/off signal of a first state upon sensing a power on state, as would be sensed when regulator 400 supplies system voltage Vs in response to an enabled EN signal.

A key array switch 500 includes a plurality of first switches 510, 520 and 530 that each connect one of the two contacts of each key in a row of keys to the battery voltage Vbatt. The key array switch 500 further includes a plurality of second switches 530, 540 and 550 that each connect the other one of the two contacts of each key in a column of keys to an enable terminal EN of the regulator 400. The key array switch 500 is disabled in response to the key on/off signal Kon/off of the first state. At this time, all the first and second switches 510-560 are turned off, i.e. switches 510-560 are open.

The key array switch 500 initially remains enabled (i.e. switches 510-560 are closed) under the condition that the terminal is in the power off state. If any key is randomly selected by the user under this condition, the battery voltage is applied to the enable terminal of the regulator, thereby enabling the regulator to supply the system voltage. As an alternative, in order for a specific key not to perform the power on function when randomly selected one of the first switches or second switches connected to the specific key may be configured to always remain open. In this case all keys connected to either the row or column the open first or second switch, respectively, are disabled.

Although FIG. 2 depicts keys of the keyboard being of double pole type, those of skill in the art will recognize that other types of switches can be utilized, including single-pole, single-throw type.

Figure 3:
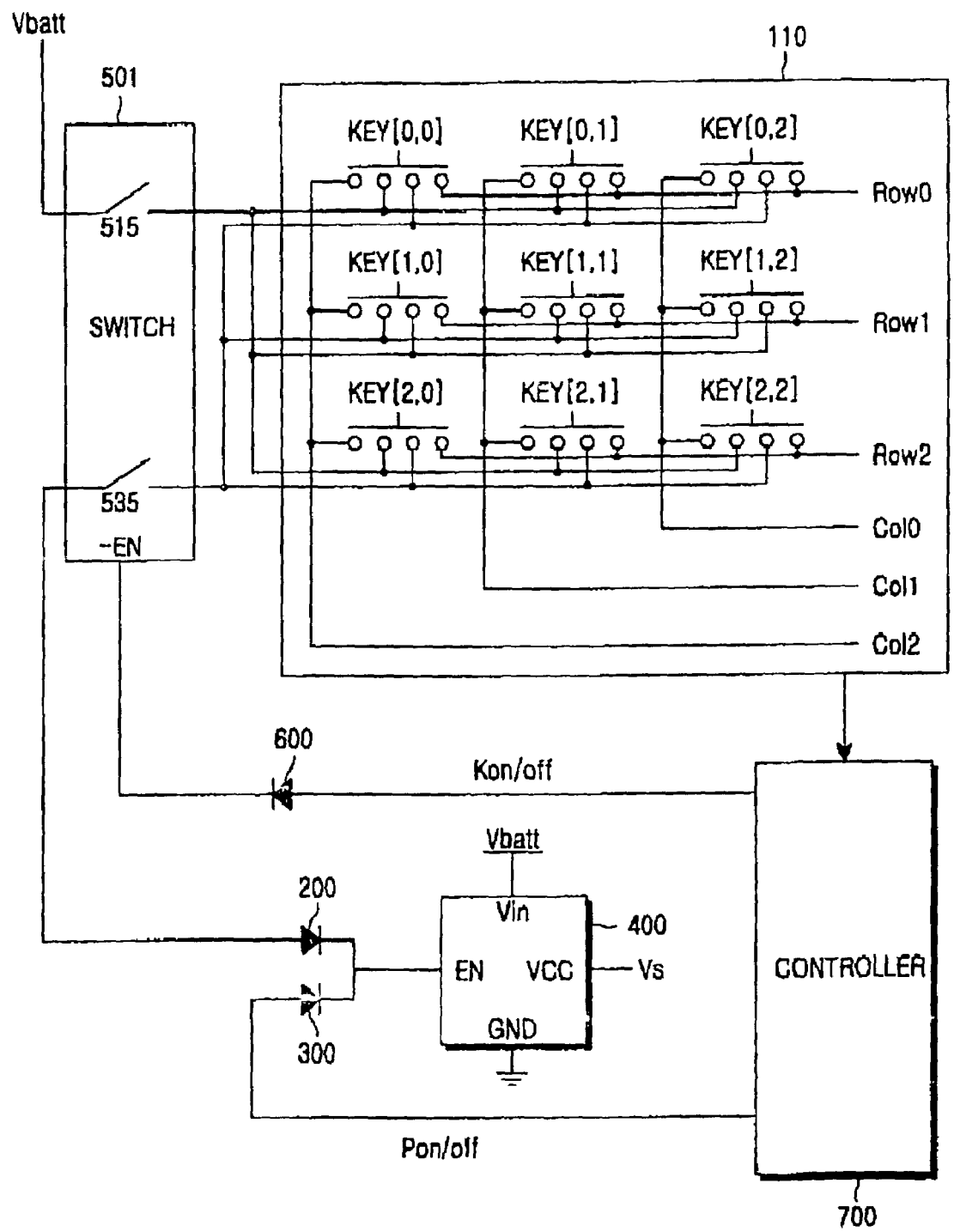
FIG. 3 is a circuit diagram showing the construction of an apparatus for powering on a terminal with a keypad through the use of a random key of the keypad in accordance with an alternative embodiment of the present invention.

FIG. 3 is a circuit diagram showing the construction of an apparatus for powering on a terminal with a keypad when a key on the keypad is randomly selected, in accordance with an alternative embodiment of the present invention.

The keypad 110 includes a plurality of tetracontact keys, each having four contacts. A device 400 for supplying a system voltage Vs, e.g. a regulator, receives a battery voltage Vbatt and outputs the system voltage Vs upon receipt of an enabling signal EN. If an arbitrary one of the keys on the keypad 110 is selected by a user, a controller 700 generates a power on/off signal Pon/off of a first state to continuously supply power to the terminal until a power off state is sensed. The controller 700 also generates a key on/off signal Kon/off of a first state up on sensing a power on state.

A key array switch 501 includes a first switch 515 for connecting one of the four contacts of each key arrayed in each row to the battery voltage Vbatt, and a second switch 535 for connecting another one of the four contacts of each key arrayed in each column to an enable terminal EN of the regulator 400. The key array switch 501 is disabled in response to the key on/off signal Kon/off of the first state. At this time, both the first and second switches 515 and 535 are turned off (i.e. opened).

On the other hand, the key array switch 501 initially remains enabled under the condition that the terminal is in the power off state. If a key is randomly selected by the user under this condition, the battery voltage Vbatt is applied to the enable terminal of the regulator 400, thereby enabling the regulator 400 to supply the system voltage Vs. Moreover, in order for a specific key not to act as a key for the powering on function the specific key is arranged of only two contacts, which do not correspond to the first and second switches 515 and 535.

In FIGS. 2 and 3, Vbatt is typically a battery voltage or a voltage coming from a battery through a circuit, which is herein referred to as the battery voltage Vbatt for convenience of description. The battery voltage Vbatt may be applied to the enable terminal EN of the regulator 400 via a diode 200, as shown, or may be applied via alternative arrangement or circuit.

A diode 600 is connected between the controller 700 and the key array switch 500 or 501 to apply the key on/off signal Kon/off from the controller 700 to the key array switch 500 or 501, and a diode 300 is connected between the controller 700 and the enable terminal EN of the regulator 400 to apply the power on/off signal Pon/off from the controller 700 to the enable terminal EN of the regulator 400. As an alternative, a set of individual switching circuits may replace key array switch 500 or 501. The first state of each of the above two signals can be set to any of a high or low level state.

With reference to FIG. 3, both the first and second switches 515 and 535 in the key array switch 501 are turned on (i.e. closed) when the terminal is powered off. As a result, the battery voltage Vbatt is connected to the second contact of each of the key (the second pole from the left of the four poles shown for each key), and the enable terminal EN of the regulator 400 is connected to the third contact of each key. As a result, unless any key is pushed under the condition that the terminal is in the power off state, the enable terminal EN of the regulator 400 is not enabled, so the terminal maintains the power off state.

If any key, e.g. KEY(0,0), is selected under this condition, the battery voltage Vbatt is applied to the enable terminal EN of the regulator 400 via the selected key KEY(0,0) to enable the regulator 400. As a result, the system voltage Vs is supplied to the terminal, which then begins to operate from that time.

The controller 700 also begins to operate from that time. Upon commencement of operation, the controller 700 generates the power on/off signal Pon/off of the first state, for example, the high level state. While the power on/off signal Pon/off is high in level, the terminal is continuously supplied with power, even though the user no longer pushes the above key that was arbitrarily selected to power on the terminal.

Thereafter, the controller 700 generates the key on/off signal Kon/off of the first state, for example, the high level state. While the key on/off signal Kon/off is high in level, all the keys on the keypad 110 are no longer used as the power keys, and perform their own unique functions (i.e. operate as general keys).

As apparent from the above description, according to the present invention, in a terminal having a keypad, keys of the keypad act as power keys in a power off state of the terminal whereas they operate as general keys (i.e. perform their own unique functions) in a power on state of the terminal, resulting in a convenience to a user. That is, the user has the convenience of turning on the terminal by pushing any key when the terminal is in the power off state.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, although 3×3 key arrays have been disclosed in the first and second embodiments for illustrative purposes, the present invention may perform the same operation with respect to other key array structures.

What is claimed is:

1. An apparatus for powering on a terminal by a random key selection, comprising:
    a keypad including a plurality of keys, wherein each key has two contacts that electrically connect upon said random key selection by a user to create an enable signal;
    a regulator that receives a battery voltage and supplies a system voltage in response to the enable signal;
    a controller for, upon sensing the random key selection, generating a power on/off signal of a first state to continuously supply power to said terminal until a power off state is sensed and, upon sensing the random key selection, generating a key on/off signal of a first state to operate utilizing subsequent input received from said plurality of keys as general keys; and
    a key array switch including: a plurality of first switches for connecting one contact of each key in a row of keys to said battery voltage and a plurality of second switches for connecting the other contact of each key in a column of keys to an enable input of said regulator, all of the first and second switches simultaneously being in one of a closed state and an open state.

2. The apparatus as set forth in claim 1, wherein said key array switch is disabled in response to said key on/of signal.

3. The apparatus as set forth in claim 1, wherein said plurality of first switches or plurality of second switches is configured to remain open, wherein the keys in either the row or the column connected to the open switches do not perform the power on function when selected and the keys in the row or the column connect to the open switches only operate as general keys.

4. An apparatus for powering on a terminal by a random key selection key, comprising:
    a keypad including a plurality of keys wherein each key has four contacts that electrically connect upon said random key selection by a user to create an enable signal;
    a regulator that receives a battery voltage and supplies a system voltage in response to the enable signal;
    a controller for, upon sensing the random key selection, generating a power on/off signal of a first state to continuously supply power to said terminal until a power off state is sensed and, upon sensing the random key selection, generating a key on/off signal of a first state; and
    a key array switch including a first switch for connecting one of said contacts of each key to said battery voltage, and a second switch for connecting another of said contacts of said keys to said regulator,
    wherein one or more of said keys have only two contacts that do not correspond to said first or second switches, so that said one or more of said keys do not perform a power on function when selected.

5. The apparatus as set forth in claim 4, wherein said key array switch is disabled in response to said key on/off signal.

6. The apparatus as set forth in claim 4, wherein said first switch and second switch are configured to remain open, wherein the keys in either the row or the column connected to the open switch do not perform the power on function when selected and the keys in the row or the column connect to the open switch only operate as general keys.

* * * * *